United States Patent [19]

Inui

[11] Patent Number: 6,052,626
[45] Date of Patent: Apr. 18, 2000

[54] PARAMETRIC ANALYZING METHOD FOR CALCULATING LIGHT INTENSITY

[75] Inventor: Hirotomo Inui, Tokyo, Japan

[73] Assignee: NEC Corporation, Tokyo, Japan

[21] Appl. No.: 09/006,013

[22] Filed: Jan. 12, 1998

[30] Foreign Application Priority Data

Jan. 16, 1997 [JP] Japan ..................... 9-005371

[51] Int. Cl.[7] ................ G06F 19/00; G06G 7/66
[52] U.S. Cl. ............... 700/121; 700/47; 700/52; 700/74; 700/109; 700/115; 700/129; 355/53; 355/55; 355/67; 355/71; 356/401
[58] Field of Search ................. 700/47, 74, 52, 700/68, 108, 109, 115, 121, 129; 355/53, 55, 71, 67, 68, 72; 356/401

[56] References Cited

U.S. PATENT DOCUMENTS

| 5,189,494 | 2/1993 | Muraki | 356/401 |
| 5,217,834 | 6/1993 | Higaki | 430/30 |
| 5,219,765 | 6/1993 | Yoshida et al. | 438/10 |
| 5,270,771 | 12/1993 | Sato | 355/53 |
| 5,363,172 | 11/1994 | Tokuda | 355/71 |
| 5,420,796 | 5/1995 | Weling et al. | 700/121 |
| 5,448,332 | 9/1995 | Sakakibara et al. | 355/53 |
| 5,461,237 | 10/1995 | Wakamoto et al. | 250/548 |
| 5,483,349 | 1/1996 | Suzuki | 356/401 |
| 5,621,497 | 4/1997 | Terasawa et al. | 355/53 |
| 5,644,390 | 7/1997 | Yasuzato | 356/121 |
| 5,661,548 | 8/1997 | Imai | 355/55 |
| 5,710,620 | 1/1998 | Taniguchi | 355/53 |
| 5,798,838 | 8/1998 | Taniguchi et al. | 356/401 |

OTHER PUBLICATIONS

"Optical Technology Contact", vol. 28, No. 3, 1990 pp. 165–175 (with Translation).

*Primary Examiner*—Paul P. Gordon
*Assistant Examiner*—Ramesh Patel

[57] ABSTRACT

The order of optical conditions and mask conditions necessary required in a photolithography process to be varied is designated so as to minimize the number of recalculations for a transmission cross-coefficient and a Fourier transform of a mask. The conditions are systemically varied and Fourier transforms of the mask and the transmission cross-coefficients are tabulated. With the resultant tables, the parametric analysis for calculating the light intensity distribution is performed.

18 Claims, 6 Drawing Sheets

PARAMETRIC ANALYZING METHOD FOR CALCULATING LIGHT INTENSITY

BACKGROUND OF THE INVENTION

1. Field of the Invention

The present invention relates to a parametric analyzing method for calculating the light intensity in a photolithography process used in a semiconductor fabrication apparatus.

2. Description of the Related Art

A photolithography process is one of the most fundamental and important fabrication processes for forming a desired pattern on a semiconductor substrate as a fabrication process for semiconductor devices such as integrated circuits.

A light exposing device used in the photolithography process has an optical system shown in FIG. 6. The optical system comprises a light source 61, a collimation lens 62, a mask 63, a condenser lens 64, and a photoresist 66. The collimated lens 62 converts light from the light source 61 into collimated light. The mask 63 has a predetermined mask pattern 63a. The condenser lens 64 forms an image of the mask pattern 63a. The photoresist 66 is disposed on a wafer 65 as an object of the photolithography process. Light emitted from the light source 61 is collimated by the collimation lens 62. The collimated light illuminates the mask 63. The light that has transmitted the mask pattern 63a on the mask 63 is condensed by the condenser lens 64. The condensed light reaches the photoresist 66 on the wafer 65 and forms an image of the mask pattern 63a. The light intensity distribution on the wafer 65 is a major factor that largely affects the resolution of the pattern, the reproducibility, and so forth.

Thus, when the light intensity distribution is analyzed, various parameters in the photolithography process can be optimized.

The light intensity distribution can be analyzed by a method using Hopkins' formula that has been disclosed in a periodical titled "Optical Technology Contact (translated title)", No. 28, 1990, pp. 165–175. According to the method for calculating light intensity using Hopkins' formula, the light intensity distribution on a wafer is given by Expression (1).

$$I(u, v) = \iiiint T(p, q; p', q') \hat{t}(p, q) \hat{t}^*(p', q') \exp[-i2\pi((p-p')u+(q-q')v)] dp\, dp'\, dq\, dq' \quad (1)$$

where t is the complex amplitude transmissivity of the mask; t* is the complex conjugate of t; $\hat{t}$ is the Fourier transform of t; T is the transmission cross-coefficient (TCC); P=lfx and q=mfy (l and m are integers, $f_x$ and $f_y$ are periodic frequencies in the x direction and y direction of the mask pattern, respectively).

The transmission cross-coefficient (TCC) in Expression (1) is given by Expression (2).

$$T(p, q; p', q') = \iint S(r, s) P(p+r, q+s) P^*(p'+r, q'+s) \exp[-i\pi\delta((p+r)^2+(q+s)^2-(p'+r)^2-(q'+s)^2)] dr\, ds \quad (2)$$

where S is an effective light source; P is a pupil function; P* is the complex conjugate of P; and δ is defocus.

The coordinates (u, v) on the wafer in Expression (1) and the defocus δ in Expression (2) have been normalized. The coordinates (u, v) and the defocus δ have the following relation with the real coordinates (U, V) and the real defocus Δ.

$$U = u\lambda/NA \quad (3\text{-}1)$$

$$V = v\lambda/NA \quad (3\text{-}2)$$

$$\Delta = \delta\lambda/(NA)^2 \quad (3\text{-}3)$$

where λ is the wavelength of light; and NA is the numerical aperture of the condenser lens.

To calculate the light intensity distribution I (u, v) with Expressions (1) and (2), assuming that l and m are integers and that p=lfx and q=mfy, from the cut-off of the pupil (that is a condition of which S(r, s) P(p+r, q+s) P*(p'+r, q'+s) is not 0), Expressions (4-1) and (4-2) are satisfied. Thus, assuming that the minimum integers l and m that satisfy Expressions (4-1) and (4-2) are the maximum degrees $l_{max}$ and $m_{max}$ of Fourier transform, Expressions (1) and (2) are calculated for up to the maximum degrees $l_{max}$ and $m_{max}$.

$$(1+\sigma)/f_x \leq 1 \quad (4\text{-}1)$$

$$(1+\sigma)/f_y \leq m \quad (4\text{-}2)$$

where σ is a coherence factor; and $f_x$ and $f_y$ are the periodic frequencies in the x direction and y direction of the mask pattern.

The above-described calculating procedure is shown with a flow chart in FIG. 5. First, initial conditions such as the coherence factor σ, the mask conditions (for example, the transmissivity of the mask and the position of the pattern), and the optical conditions (for example, the light source and pupil) are set (at step 51). Next, with Expression (4), the maximum degrees $l_{max}$ and $m_{max}$ are calculated (at step 52). With Expression (2), the transmission cross-coefficients are calculated for up to the maximum degrees $l_{max}$ and $m_{max}$ and the calculated results are tabulated as a table (at step 53). The Fourier transforms of the transmissivity t of the mask (hereinafter referred to as Fourier transforms of the mask) are calculated for up to the maximum degrees $l_{max}$ and $m_{max}$ and then the calculated results are tabulated as a table (at step 54). With the tables generated at step 53 and 54 and Expression (1), the light intensity distribution I (u, v) on the wafer is calculated (at step 55). It is determined whether or not the light intensity distributions I (u, v) have been calculated for all the conditions (at step 56). When the determined result at step 56 is No, the conditions of the coherence factor σ, the transmissivity of the mask, the position of the pattern, the light source, the pupil, and so forth are varied for the conditions and steps 52 to 56 are performed. Until the light intensity distributions I are calculated for all the conditions, steps 52 to 56 are repeated.

In the above-described conventional calculating method for the light intensity distribution, the transmission cross-coefficients and the Fourier transforms of the mask are calculated for all the conditions. Thus, it takes a very long time to complete such calculations.

SUMMARY OF THE INVENTION

An object of the present invention is to provide an analyzing method for the light intensity distribution that designates the varying order of the coherence factor σ, the mask conditions (such as the transmissivity of the mask and the position of the pattern), and the optical conditions (such as the light source and the pupil) and systematically varies the conditions so as to reduce the number of calculations for the transmission cross-coefficients and Fourier transforms of the mask and thereby allow the light intensity distribution in the photolithography process to be calculated at high speed.

A first aspect of the present invention is a parametric analyzing method for calculating light intensity with a coherence factor σ, mask conditions (parameters that represent characteristics of a mask, the parameters composed of any combination of the position of the pattern, the pitches of the pattern, the transmissivity of the mask, and the amount of the phase variation of the phase-shift mask), and optical conditions (parameters that represent the characteristics of an exposing optical system composed of any combination of the shape of a light source, the intensity of the light source, defocus, aberration, the phase of a pupil, the transmissivity of the pupil, the shaped of the pupil, the numeral aperture NA of a condenser lens) varied in the order thereof, the method comprising the steps of:

(a) setting the optical conditions, calculating transmission cross-coefficients for up to the maximum degrees $L^T_{max}$ and $M^T_{max}$ that depend on the maximum value $\sigma_{max}$ of the coherence factor σ and on the minimum value $f_{min}$ of the periodic frequency f of the mask pattern, respectively, and tabulating the calculated results as a table;

(b) setting the mask conditions, calculating Fourier transforms of the mask for up to the maximum degrees $L^M_{max}$ and $M^M_{max}$ that depend on the maximum value $\sigma_{max}$ of the coherence factor σ and on the periodic frequency f of the mask pattern corresponding to the mask conditions that have been set, respectively, and tabulating the calculated results as a table;

(c) setting the value of the coherence factor α, varying the coherence factor σ with the tables generated at steps (a) and (b) and Expression (1) until the light intensity distributions are calculated for all the values of the coherence factor σ, and repeatedly calculating the light intensity distributions;

(d) varying the mask conditions and repeating steps (b) and (c) until the light intensity distributions are calculated for all the mask conditions; and (e) varying the optical conditions and repeating steps (a) to (d) until the light intensity distributions are calculated for all the optical conditions.

Another aspect of the present invention is a parametric analyzing method for calculating light intensity with a coherence factor σ, optical conditions, and mask conditions varied in the order thereof, comprising the steps of:

(a) setting the mask conditions, calculating Fourier transforms of the mask for up to the maximum degree that depends on the maximum value $\sigma_{max}$ of the coherence factor σ and on the periodic frequency f of the mask pattern corresponding to the mask conditions that have been set, and tabulating the calculated results as a table;

(b) setting the optical conditions, calculating the transmission cross-coefficients for up to the maximum degree that depends on the maximum value $\sigma_{max}$ of the coherence factor σ and on the periodic frequency f of the mask pattern of the mask conditions that have been set, and tabulating the calculated results as a table;

(c) setting the value of the coherence factor α, varying the coherence factor σ with the tables generated at steps (a) and (b) and Expression (1) until the light intensity distributions are calculated for all the values of the coherence factor σ, and repeatedly calculating the light intensity distributions;

(d) varying the optical conditions and repeating steps (b) and (c) until the light intensity distributions are calculated for all the optical conditions; and (e) varying the mask conditions and repeating steps (a) to (d) until the light intensity distributions are calculated for all the mask conditions.

The mask conditions are data that represents characteristics of the mask. The mask conditions are composed of any combination of the shape of the mask pattern, the position of the mask pattern, the pitches of the mask pattern, the transmissivity of the mask, and the amount of phase variation of the phase-shift mask. The optical conditions are data that represents characteristics of the exposing optical system of the exposing unit. The optical conditions are composed of any combination of the shape of the light source, the light intensity of the light source, the wavelength of light, the defocus, the aberration, the phase of the pupil, the transmissivity of the pupil, the shape of the pupil, the numerical aperture NA of the condenser lens, and the coherence factor σ. In the calculations, since the value of the coherence factor σ is independently varied, any combination excluding the coherence factor σ is used as the optical conditions.

In the calculations for the light intensity with Expression (1), the transmission cross-coefficients and the Fourier transforms of the mask can be independently calculated. Thus, when the conditions are varied, the calculated results of the transmission cross-coefficients and the Fourier transforms can be independently tabulated as respective tables. According to the present invention, the light intensity distributions I (u, v) are calculated with these tables. Thus, whenever a light intensity distribution I (u, v) is calculated, it is not necessary to calculate a transmission cross-coefficient and a Fourier transform of the mask. Thus, the calculation time can be reduced.

The sizes of the tables depend on the maximum degree corresponding to both the coherence factor σ that satisfies the cut-off condition of the pupil and to the periodic frequency f of the mask pattern. In other words, the table of the transmission cross-coefficients depends on the maximum degrees $L^T_{max}$ and $M^T_{max}$. The size of the table of the Fourier transforms of the mask depends on the maximum degrees $L^M_{max}$ and $M^M_{max}$. In addition, the size of the table of the Fourier transforms and the size of the table of the transmission cross-coefficients necessary for calculating the light intensity distribution for a particular value of the coherence factor σ depends on the maximum degrees $l_{max}$ and $m_{max}$, respectively.

The maximum degrees that correspond to the sizes of the tables are given by Expressions (4-1) and (4-2). When a light intensity distribution is calculated, if the conditions are varied in the order of the coherence factor σ, the mask conditions, and the optical conditions, since the table of the transmission cross-coefficients should correspond to all the mask conditions and all the values of the coherence factor σ in the optical conditions that have been set, the maximum degrees $L^T_{max}$ and $M^T_{max}$ necessary for calculating the transmission cross-coefficients (hereinafter, the maximum degrees $L^T_{max}$ and $M^T_{max}$ are referred to as the maximum degrees of the transmission cross-coefficients) are obtained with Expressions (5-1) and (5-2) that are given by Expressions (4-1) and (4-2) using the maximum value $\sigma_{max}$ of the coherence factor σ and the minimum value $f_{min}$ of the periodic frequency f of the mask pattern in the mask conditions. Strictly speaking, although Expressions (5-1) and (5-2) are inequalities as with Expressions (4-1) and (4-2), for convenience, they are expressed as equalities. Such expressions are applied to other equalities. Likewise, the table of the Fourier transforms of the mask should correspond to all the values of the coherence factor σ in the mask conditions that have been set. Thus, the maximum degrees $L^M_{max}$ and $M^M_{max}$ necessary for calculating the Fourier transforms of the mask are given by Expressions (6-1) and (6-2) using the maximum value $\sigma_{max}$ of the coherence factor σ as with the transmission cross-coefficients. Hereinafter, the maximum degrees $L^M_{max}$ and $M^M_{max}$ are referred to as maximum degrees of the Fourier transforms of the mask. In addition, the maximum degrees $l_{max}$ and $m_{max}$ of the Fourier transforms of the mask and the transmission cross-coefficients necessary for calculating the light intensity distribution under the coherence factor σ, the mask conditions, and the optical conditions that have been set are given by Expressions (7-1) and (7-2) using the coherence factor σ and the periodic frequency f of the mask pattern that have been set.

$$L^T_{max}=(1+\sigma m_{ax})/f_{xmin} \quad (5\text{-}1)$$

$$M^T_{max}=(1+\sigma m_{ax})/f_{ymin} \quad (5\text{-}2)$$

$$L^M_{max}=(1+\sigma m_{ax})/f_x \quad (6\text{-}1)$$

$$M^M_{max}=(1+\sigma m_{ax})/f_y \quad (6\text{-}2)$$

$$l_{max}=(1+\sigma)/f_x \quad (7\text{-}1)$$

$$m_{max}=(1+\sigma)/f_y \quad (7\text{-}2)$$

where $\sigma_{max}$ is the maximum value of the coherence factor σ; $f_{xmin}$ and $f_{ymin}$ are the minimum values of the periodic frequencies $f_x$ and $f_y$ in the x direction and y direction of the mask pattern.

When the coherence factor σ, the optical conditions, and the mask conditions are varied in the order thereof, the table of the Fourier transforms of the mask should correspond to all the values of the coherence factor σ and all the optical conditions in the mask conditions that have been set. However, as clear from Expressions (4-1) and (4-2), since the maximum degrees do not depend on the optical conditions, the table of the Fourier transforms of the mask should just correspond to all the values of the coherence factor σ. Thus, as with the above description, the maximum degrees $L^M_{max}$ and $M^M_{max}$ of the Fourier transforms of the mask are given by Expressions (6-1) and (6-2). In addition, the table of the transmission cross-coefficients should correspond to all the values of the coherence factor σ under the mask conditions and the optical conditions that have been set. Thus, the maximum degrees $L^T_{max}$ and $M^T_{max}$ of the transmission cross-coefficients are given by Expressions (8-1) and (8-2) using the maximum value $\sigma_{max}$ of the coherence factor σ and the periodic frequency f of the mask pattern in the mask conditions that have been set. Although the maximum degrees $L^T_{max}$ and $M^T_{max}$ of the transmission cross-coefficients may be given by Expressions (5-1) and (5-2), to reduce the calculation time, it is necessary to omit unnecessary calculations. Thus, in this case, Expressions (8-1) and (8-2) are used. The maximum degrees $l_{max}$ and $m_{max}$ are obtained in the same manner as the case that the conditions are varied in the order of the coherence factor σ, the mask conditions, and the optical conditions.

$$L^T_{max}=(1+\sigma_{max})/f_x \quad (8\text{-}1)$$

$$M^T_{max}=(1+\sigma_{max})/f_y \quad (8\text{-}2)$$

With Expressions (5-1) to (8-2), the relations of Expressions (9-1) and (9-2) are satisfied between each maximum degree.

$$l_{max} \leq L^M_{max} \leq L^T_{max} \quad (9\text{-}1)$$

$$m_{max} \leq M^M_{max} \leq M^T_{max} \quad (9\text{-}2)$$

When the light intensity distributions I (u, v) are calculated with the coherence factor σ varied under the optical conditions and the mask conditions that have been set, the sizes of the tables of the transmission cross-coefficients and the Fourier transforms of the mask necessary for the calculations of the light intensity distributions I (u, v) do not exceed the sizes of the tables of the transmission cross-coefficients and the Fourier transforms of the mask that have been generated beforehand. Thus, for calculating the light intensity distributions I (u, v), the tables of the transmission cross-coefficients and the Fourier transforms of the mask that have been generated beforehand can be used. Thus, it is not necessary to calculate a Fourier transform of the mask and a transmission cross-coefficient for calculating a light intensity distribution I (u, v), thereby reducing the calculation time.

These and other objects, features and advantages of the present invention will become more apparent in light of the following detailed description of a best mode embodiment thereof, as illustrated in the accompanying drawings.

DESCRIPTION OF PREFERRED EMBODIMENTS

First Embodiment

Figure 1:
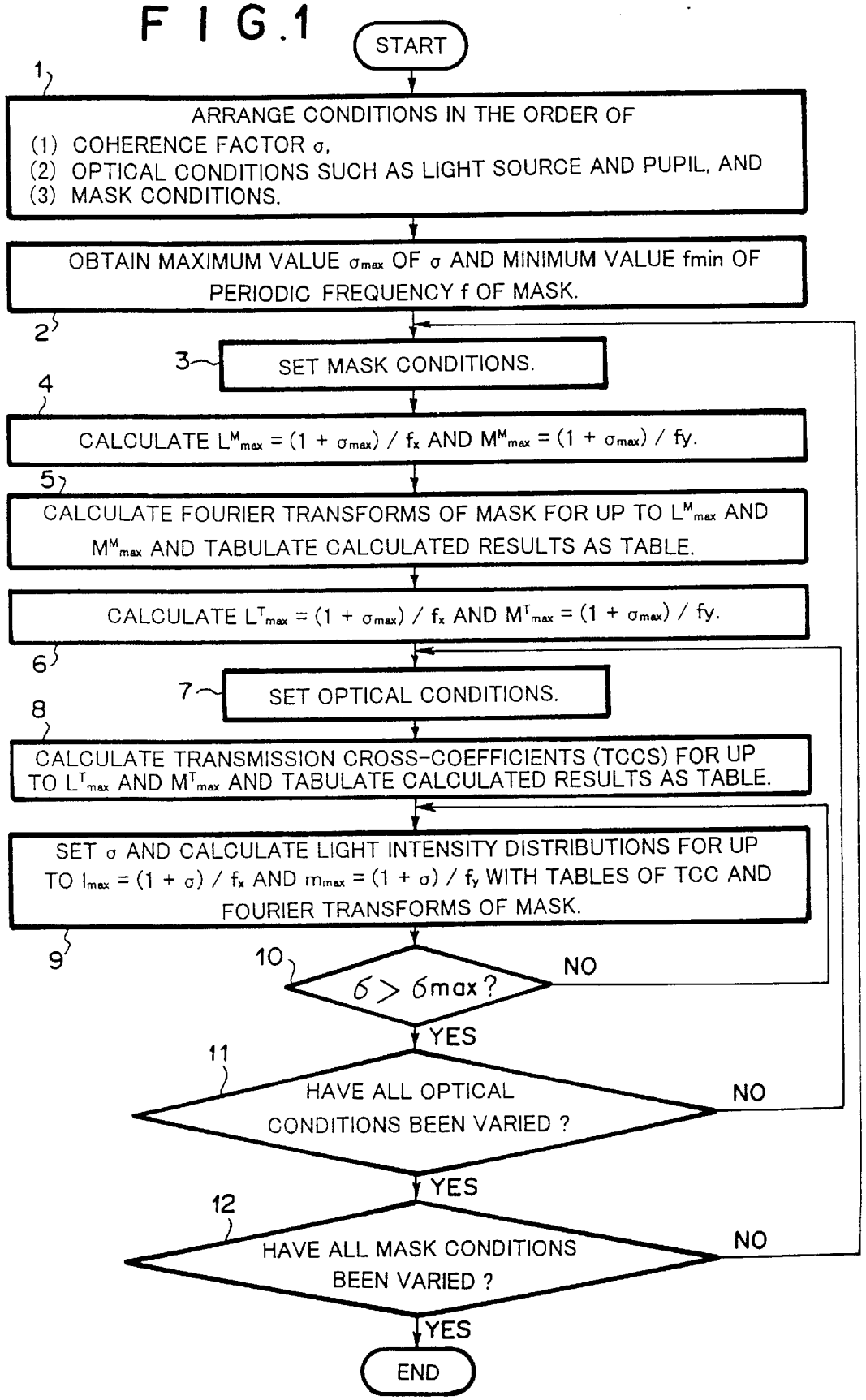
FIG. 1 is a flow chart showing a first embodiment of the present invention.

The light intensity distribution can be analyzed by a method using Hopkins' formula as following Expression (1), $$I(u, v) = \iiint \hat{T}(p, q; p', q')\hat{t}(p, q)\hat{t}^*(p',q') \exp[-i2\pi((p-p')u+(q-q')v)]dp\, dp'\, dq\, dq' \quad (1)$$

where t is the complex amplitude transmissivity of the mask; t* is the complex conjugate of t; $\hat{t}$ is the Fourier transform of t; T is the transmission cross-coefficient (TCC); P=lfx and q=mfy (l and m are integers, $f_x$ and $f_y$ are periodic frequencies in the x direction and y direction of the mask pattern, respectively). According to the method for calculating light intensity using Hopkins' formula, the light intensity distribution on a wafer is given by Expression (1).

The transmission cross-coefficient (TCC) in Expression (1) is given by Expression (2).

$$T(p, q; p', q') = \iint S(r, s)P(p+r,q+s)P^*(p'+r,q'+s) \exp[-i\pi\delta((p+r)^2+(q+s)^2-(p'+r)^2-(q'+s)^2)]dr\, ds \quad (2)$$

where S is an effective light source; P is a pupil function; P* is the complex conjugate of P; and δ is defocus.

Therefore, with reference to a flow chart shown in FIG. 1, a first embodiment of the present invention will be described. Given data necessary for analysis is categorized as three types that are a coherence factor σ, optical conditions, and mask conditions. The categorized data are arranged in the order of the coherence factor σ, the optical conditions, and the mask conditions (at step 1). The maximum value $\sigma_{max}$ of the coherence factor σ and the minimum values $f_{xmin}$ and $f_{ymin}$ of the periodic frequencies $f_x$ and $f_y$ of a mask pattern that depend on the mask conditions are obtained (at step 2).

Next, the mask conditions are set (at step 3). With Expressions (6-1) and (6-2), the maximum degrees $L^M_{max}$ and $M^M_{max}$ of the Fourier transforms of the mask are calculated (at step 4). The Fourier transforms of the mask are calculated for up to the maximum degrees $L^M_{max}$ and $M^M_{max}$ and the calculated results are tabulated as a table (at step 5). The maximum degrees $L^T_{max}$ and $M^T_{max}$ of the transmission cross-coefficients are calculated with Expressions (8-1) and (8-2) (at step 6). Optical conditions are set (at step 7). With Expression (2), the transmission cross-coefficients are calculated for up to the maximum degrees $L^T_{max}$ and $M^T_{max}$ and the calculated results are tabulated as a table (at step 8). A value of the coherence factor σ is set. With Expressions (7-1) and (7-2), the maximum degrees $l_{max}$ and $m_{max}$ corresponding to the value of the coherence factor σ are calculated.

With the tables generated at steps 8 and 5 and Expression (1), the light intensity distributions I (u, v) on the wafer are calculated for up to the maximum degrees $l_{max}$ and $m_{max}$ (at step 9). It is determined whether or not the light intensity distributions I (u, v) have been calculated for all the values of the coherence factor σ (at step 10). The value of the coherence factor σ is varied and steps 9 and 10 are repeated until the light intensity distributions I (u, v) are calculated for all the values of the coherence factor σ.

Next, it is determined whether or not the light intensity distributions I (u, v) have been calculated for all the optical conditions (at step 11). The optical conditions are varied and steps 7 to 11 are repeated until the light intensity distributions I (u, v) are calculated for all the optical conditions. After the light intensity distributions I (u, v) have been calculated for all the optical conditions, it is determined whether or not the light intensity distributions I (u, v) have been calculated for all the mask conditions (at step 12) The mask conditions are varied and steps 3 to 12 are repeated until the light intensity distributions I (u, v) are calculated for all the mask conditions.

After the light intensity distributions I (u, v) have been calculated for all the mask conditions, the analysis of the light intensity distributions is completed.

With mask conditions of 1.2 μm pitches and 1:1 hole pattern and optical conditions of light wavelength λ=0.248 μm and numerical number NA of condenser lens=0.5 in a stepper exposing unit, only the coherence factor σ was varied from 0.3 to 0.7 and the light intensity distributions I (u, v) were calculated so as to evaluate the calculation time. The evaluated results are shown in FIG. 2.

Figure 2:
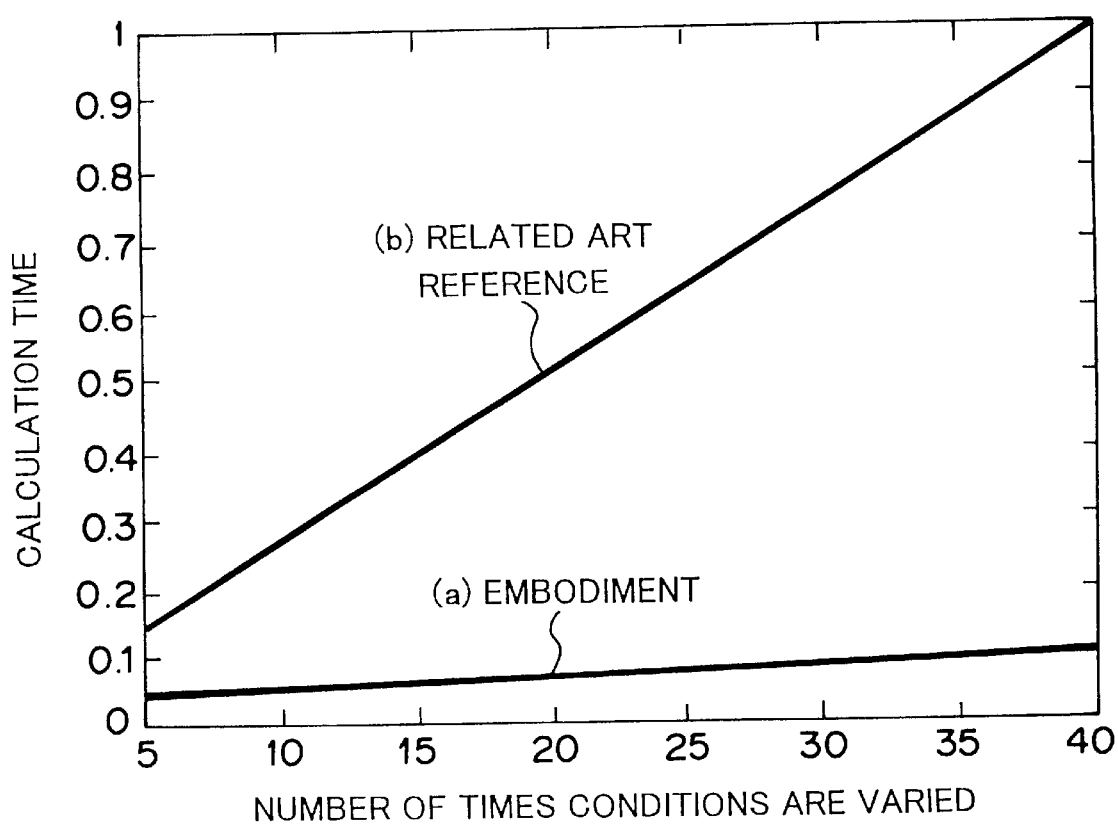
FIG. 2 is a graph showing calculation time for which light intensity distributions are calculated according to the first embodiment of the present invention.

In FIG. 2, the horizontal axis represents the number of values of the coherence factor σ. The vertical axis represents the normalized calculation time. A straight line (a) represents the result of the embodiment. A straight line (b) represents the result of the related art reference. A bit map of the light source has an accuracy of 0.05 σ. The light intensity distributions were measured at intervals of 1.2/128 μm for 128 points.

In the case that the coherence factor σ is varied 40 times, in the related art reference, 40 transmission cross-coefficients should be calculated while the coherence factor σ is varied. However, in the method according to the present invention, one transmission cross-coefficient is calculated with coherence factor σ=0.7. Thus, the calculation speed in the method of the present invention is 10 times faster than that of the related art reference.

First Modification of First Embodiment

Step 1 in FIG. 1 is omitted. In other words, the step of which given data is categorized as three types that are the coherence factor σ, the optical conditions, and the mask conditions and arranged in the order thereof. Thereafter, the parametric analysis for calculating the light intensity is performed after step 2 in FIG. 1.

Second Modification of First Embodiment

With reference to a flow chart shown in FIG. 3, a second modification of the first embodiment of the present invention will be described.

With give data necessary for analysis, the maximum value $\sigma_{max}$ of the coherence factor σ and the minimum values $f_{xmin}$ and $f_{ymin}$ of the periodic frequencies $f_x$ and $f_y$ of the mask pattern that depend on the mask conditions are obtained (at step 13). Next, with Expressions (5-1) and (5-2), the maximum degrees $L^T_{max}$ and $M^T_{max}$ of the transmission cross-coefficients are calculated (at step 14). Mask conditions are set (at step 15). With Expressions (6-1) and (6-2), the maximum degrees $L^M_{max}$ and $M^M_{max}$ of the Fourier transforms of the mask are calculated (at step 16). The Fourier transforms of the mask are calculated for up to the maximum degrees $L^M_{max}$ and $M^M_{max}$ (at step 17).

Next, optical conditions are set (at step 18). With Expression (2), the transmission cross-coefficients are calculated for up to the maximum degrees $L^M_{max}$ and $M^M_{max}$ and the calculated results are tabulated as a table (at step 19). A value of the coherence factor σ is set. With Expressions (7-1) and (7-2), the maximum degrees $l_{max}$ and $m_{max}$ corresponding to the value of the coherence factor σ are calculated. With the tables generated at steps 19 and 17 and Expression (1), the light intensity distributions I (u, v) are calculated for up to the maximum degrees $l_{max}$ and $m_{max}$ (at step 20).

It is determined whether or not the light intensity distributions I (u, v) have been calculated for all the values of the coherence factor σ (at step 21). The value of the coherence factor σ is varied and steps 20 and 21 are repeated until the light intensity distributions I (u, v) are calculated for all the values of the coherence factor σ. Next, it is determined whether or not the light intensity distributions I (u, v) have been calculated for all the optical conditions (at step 22). The optical conditions are varied and steps 18 to 22 are repeated until the light intensity distributions I (u, v) are calculated for all the optical conditions. After the light intensity distributions I (u, v) have been calculated for all the optical conditions, it is determined whether or not the light intensity distributions I (u, v) have been calculated for all the mask conditions (at step 23). The mask conditions are varied and steps 15 to 23 are repeated until the light intensity distributions I (u, v) are calculated for all the mask conditions.

After the light intensity distributions I (u, v) have been calculated for all the mask conditions, the analysis for the light intensity distributions is completed.

Third Modification of First Embodiment

Figure 3:
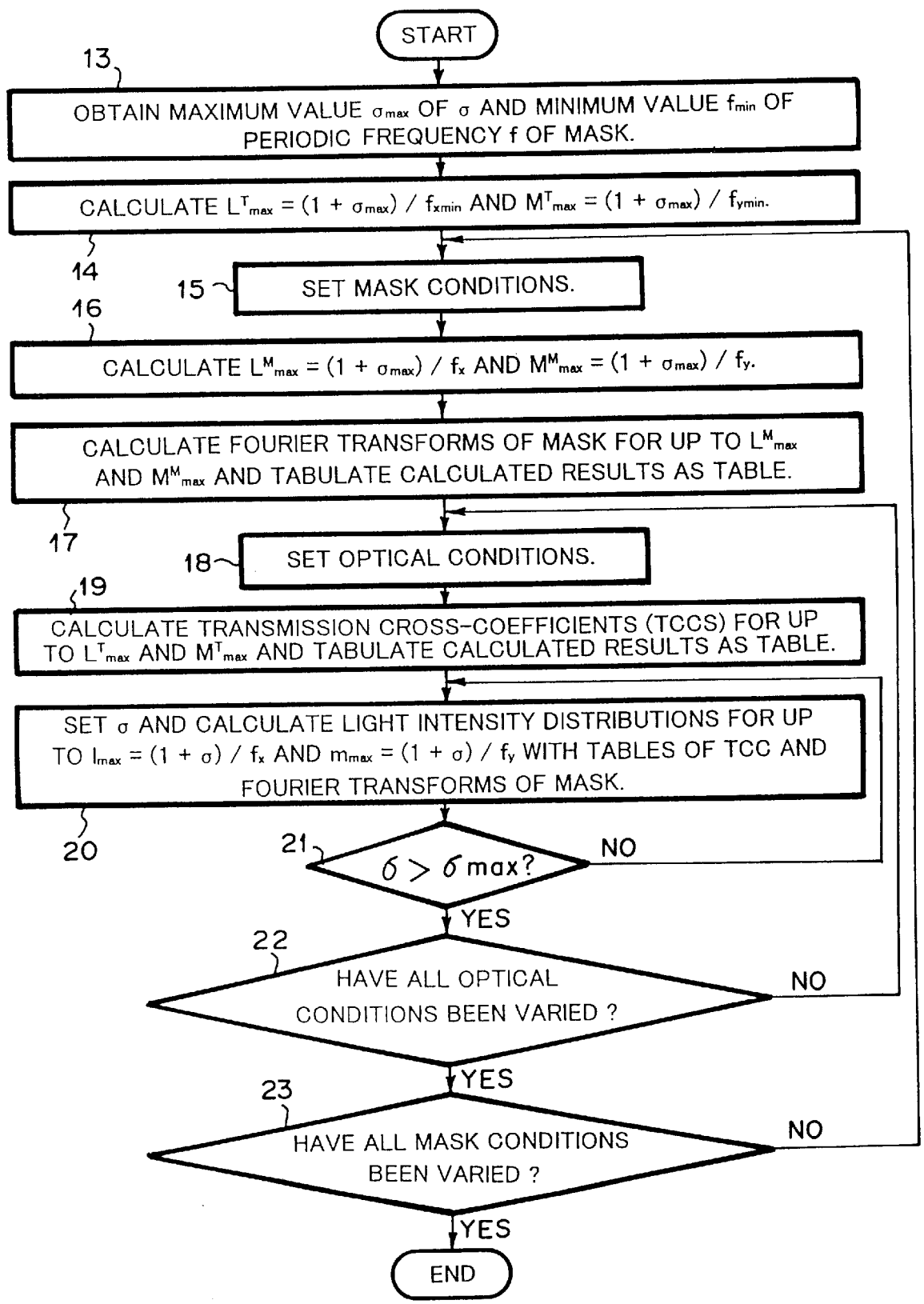
FIG. 3 is a flow chart showing a modification of the first embodiment of the present invention.

After the step for categorizing give data necessary for analysis as a coherence factor σ, optical conditions, and mask conditions and arranging them in the order thereof, steps 13 to 23 in FIG. 3 are performed. In other words, with the second modification of the first embodiment, the parametric analysis for calculating the light intensity is performed.

Second Embodiment

Figure 4:
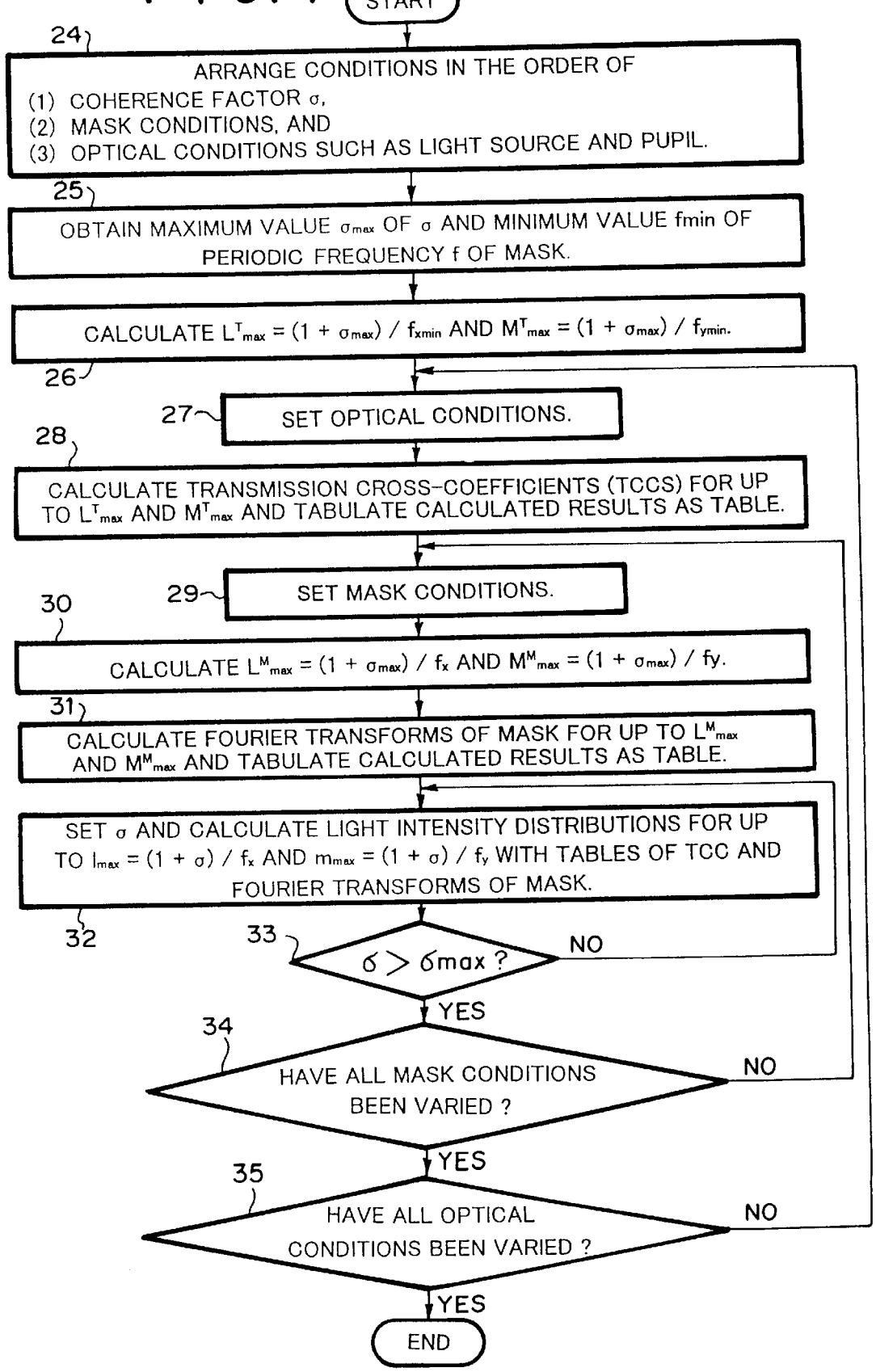
FIG. 4 is a flow chart showing a second embodiment of the present invention.
Figure 5:
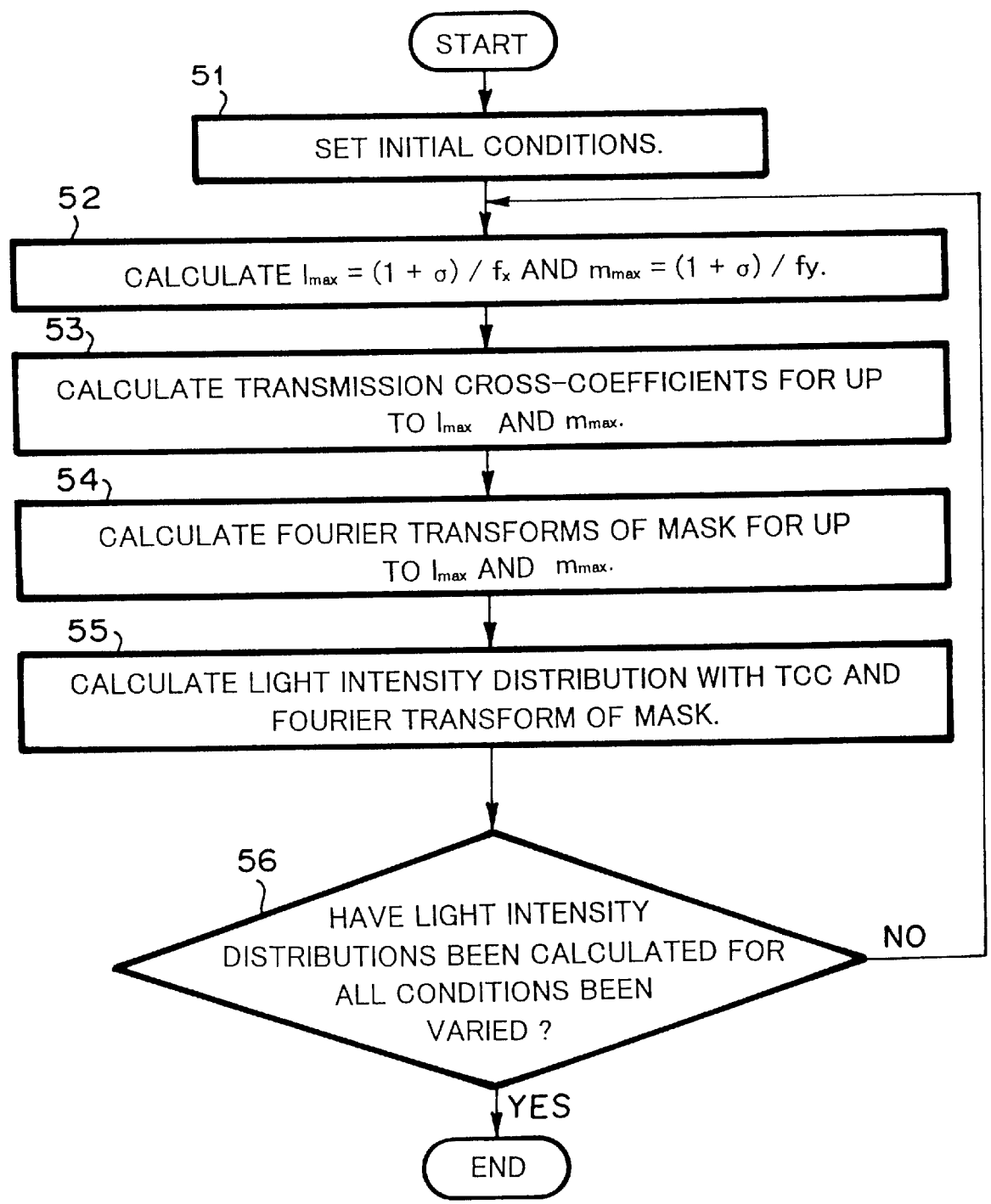
FIG. 5 is a flow chart showing a related art reference.
Figure 6:
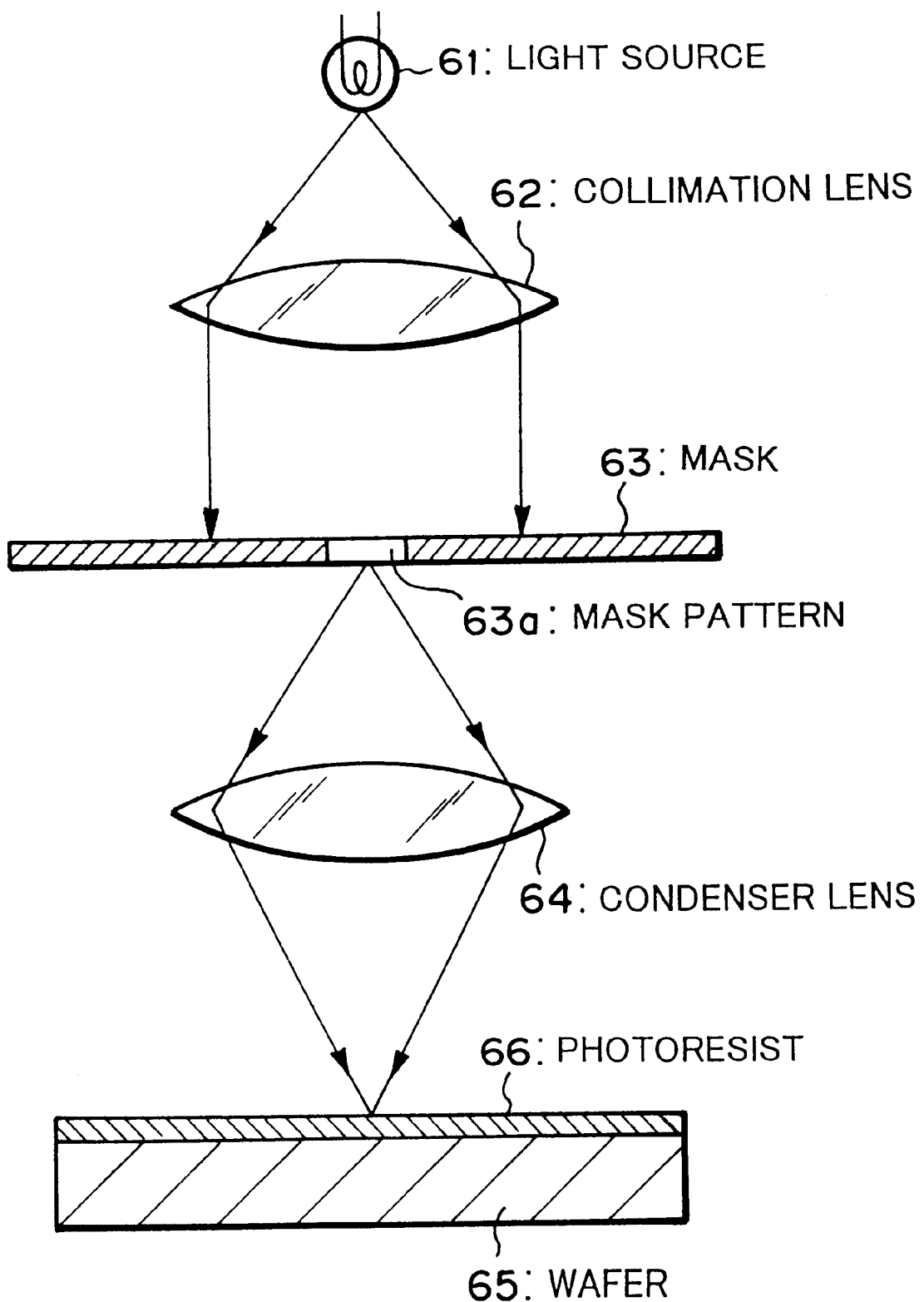
FIG. 6 is a schematic diagram showing an optical system of an exposing unit.

Next, with reference to a flow chart shown in FIG. 4, a second embodiment of the present invention will be described.

Given data necessary for analysis is categorized as three types that are a coherence factor σ, mask conditions, and optical conditions and arranged in the order thereof (at step 24). The maximum value $\sigma_{max}$ of the coherence factor σ and the minimum values $f_{xmin}$ and $f_{ymin}$ of the periodic frequencies $f_x$ and $f_y$ of the mask pattern that depend on the mask conditions are obtained (at step 25).

With Expressions (5-1) and (5-2), the maximum degrees $L^T_{max}$ and $M^T_{max}$ of the transmission cross-coefficients are calculated (at step 26). Optical conditions are set (at step 27). With Expression (2), the transmission cross-coefficients are calculated for up to the maximum degrees $L^T_{max}$ and $M^T_{max}$ and the calculated results are tabulated as a table (at step 28). Mask conditions are set (at step 29).

With Expressions (6-1) and (6-2), the maximum degrees $L^M_{max}$ and $M^M_{max}$ of the Fourier transforms of the mask are calculated (at step 30). The Fourier transforms of the mask are calculated for up to the maximum degrees $L^M_{max}$ and $M^M_{max}$ and the calculated results are tabulated as a table (at step 31). A value of the coherence factor σ is set. With Expressions (4-1) and (4-2), the maximum degrees $l_{max}$ and $m_{max}$ corresponding to the value of the coherence factor σ are obtained. With the tables generated at steps 28 and 31 and Expression (1), the light intensity distributions I (u, v) on the wafer are calculated for up to the maximum degrees $l_{max}$ and $m_{max}$ (at step 32). The value of the coherence factor σ is checked out (at step 33). The value of the coherence factor σ is varied and steps 32 and 33 are repeated until the light intensity distributions I (u, v) are calculated for all the values of the coherence factor σ. Next, the mask conditions are checked out (at step 34). The mask conditions are varied and steps 29 to 34 are repeated until the light intensity distributions I (u, v) are calculated for all the mask conditions.

After the light intensity distributions I (u, v) have been calculated for all the mask conditions, the optical conditions are checked out (at step 35). The optical conditions are varied and steps 27 to 35 are repeated until the light intensity distributions I (u, v) are calculated for all the optical conditions. After the light intensity distributions I (u, v) have been calculated for all the optical conditions, the analysis of the light intensity distributions I (u, v) is completed.

In the second embodiment, since the mask conditions are varied before the optical conditions are varied, the light intensity distributions I (u, v) for the mask conditions can be more quickly calculated than those in the first embodiment. Thus, the mask can be optimized. In addition, the number of calculations for the transmission cross-coefficients that require long calculation time is smaller than that of the Fourier transforms of the mask. Thus, the calculations in the second embodiment can be more quickly performed than the calculations in the first embodiment.

Modification of Second Embodiment

The step for categorizing given data necessary for analysis as a coherence factor σ, mask conditions, and optical conditions and arranging the categorized data in the order thereof is omitted. The analysis of the parametric for calculating the light intensity is performed after step 25 shown in FIG. 4.

As described above, the varying order of conditions such as a coherence factor σ, mask conditions (for example, the transmissivity of the mask and the position of the pattern), and optical conditions (for example, the light source and the pupil) is designated so as to decrease the number of calculations for the transmission cross-coefficients and the Fourier transforms of the mask. The designated conditions are systematically varied. The transmission cross-coefficients and the Fourier transforms of the mask are tabulated as respective tables. Since the light intensity distributions are calculated with the tables, whenever a light intensity distribution is calculated, it is not necessary to calculate a transmission cross-coefficient and a Fourier transform of the mask. Thus, the light intensity distributions in the photolithography process can be calculated at high speed.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A parametric analyzing method for calculating a light intensity distribution on a wafer with Expression (1) under given optical conditions and mask conditions in a photolithography process as a fabrication process of semiconductor devices, $$I(u,v) = \iiint \int \hat{T}(p, q; p', q') \hat{t}(p, q) \hat{t}^*(p',q') \exp[-i2\pi((p-p')u+(q-q')v)] dp\, dp'\, dq\, dq' \quad (1)$$

where t is the complex amplitude transmissivity of the mask; t* is the complex conjugate of t; $\hat{t}$ is the Fourier transform of t; T is the transmission cross-coefficient (TCC); p=lfx and q=mfy (l and m are integers, $f_x$ and $f_y$ are periodic frequencies in the x direction and y direction of the mask pattern, respectively, the method comprising the steps of:

(a) assuming that an integer that depends on the maximum value of a coherence factor and on the minimum value of the periodic frequency of the mask pattern of the mask conditions is the maximum degree, setting the optical conditions, calculating transmission cross-coefficients for up to the maximum degree, and tabulating the calculated results as a table;

(b) setting the mask conditions, assuming that an integer that depends on the maximum value of the coherence factor and on the periodic frequency of the mask pattern of the mask conditions that have been set is the maximum degree, calculating the Fourier transforms of the mask for up to the maximum degree, and tabulating the calculated results as a table;

(c) setting the value of the coherence factor, varying the coherence factor with the tables generated at steps (a) and (b) and Expression (1), and calculating the light intensity distributions for all the values of the coherence factor;

(d) varying the mask conditions and repeating steps (b) and (c) until the light intensity distributions are calculated for all the mask conditions; and (e) varying the optical conditions and repeating steps (a) to (d) until the light intensity distributions are calculated for all the optical conditions.

2. The parametric analyzing method as set forth in claim 1, wherein the optical conditions are data that represents characteristics of an optical system, the optical conditions being composed of any combination of the shape of a light source, the light intensity thereof, defocus, aberration, the phase of a pupil, the transmissivity thereof, the shape thereof, the numerical aperture NA of a condenser lens, and the coherence factor.

3. The parametric analyzing method as set forth in claim 1,
   wherein the mask conditions are data that represents characteristics of the mask, the mask conditions being composed of any combination of the shape of a mask pattern, the position thereof, the pitches thereof, the transmissivity of the mask, and the amount of the phase variation thereof.

4. A parametric analyzing method for calculating a light intensity distribution on a wafer with Expression (1) under given optical conditions and mask conditions in a photolithography process as a fabrication process of semiconductor devices, $$I(u,v) = \iiiint \hat{T}(p, q; p', q') \hat{t}(p, q) \hat{t}^*(p', q') \exp[-i2\pi((p-p')u + (q-q')v)] dp\, dp'\, dq\, dq' \quad (1)$$

where t is the complex amplitude transmissivity of the mask; t* is the complex conjugate of t; $\hat{t}$ is the Fourier transform of t; T is the transmission cross-coefficient (TCC); p=lfx and q=mfy (l and m are integers, $f_x$ and $f_y$ are periodic frequencies in the x direction and y direction of the mask pattern, respectively, the method comprising the steps of:

(a) categorizing given data as a coherence factor, the mask conditions, and the optical conditions and arranging the given data in the order thereof;

(b) assuming that an integer that depends on the maximum value of the coherence factor and on the minimum value of the periodic frequency of the mask pattern of the mask conditions is the maximum degree, setting the optical conditions, calculating the transmission cross-coefficients for up to the maximum degree, and tabulating the calculated result as a table;

(c) setting the mask conditions, assuming that an integer that depends on the maximum value of the coherence factor and on the periodic frequency of the mask pattern of the mask conditions that have been set is the maximum degree, calculating the Fourier transforms for up to the maximum degree, and tabulating the calculated results as a table;

(d) setting the value of the coherence factor, varying the value of the coherence factor with the tables generated at steps (2) and (3) and Expression (1), and calculating the light intensity distributions for all the values of the coherence factor;

(e) varying the mask conditions and repeating steps (c) and (d) until the light intensity distributions are calculated for all the mask conditions; and (f) varying the optical conditions and repeating steps (b) to (e) until the light intensity distributions are calculated for all the optical conditions.

5. The parametric analyzing method as set forth in claim 4,
   wherein the optical conditions are data that represents characteristics of an optical system, the optical conditions being composed of any combination of the shape of a light source, the light intensity thereof, defocus, aberration, the phase of a pupil, the transmissivity thereof, the shape thereof, the numerical aperture NA of a condenser lens, and the coherence factor.

6. The parametric analyzing method as set forth in claim 4,
   wherein the mask conditions are data that represents characteristics of the mask, the mask conditions being composed of any combination of the shape of a mask pattern, the position thereof, the pitches thereof, the transmissivity of the mask, and the amount of the phase variation thereof.

7. A parametric analyzing method for calculating a light intensity distribution on a wafer with Expression (1) under given optical conditions and mask conditions in a photolithography process as a fabrication process of semiconductor devices, $$I(u,v) = \iiiint \hat{T}(p, q; p', q') \hat{t}(p, q) \hat{t}^*(p', q') \exp[-i2\pi((p-p')u + (q-q')v)] dp\, dp'\, dq\, dq' \quad (1)$$

where t is the complex amplitude transmissivity of the mask; t* is the complex conjugate of t; $\hat{t}$ is the Fourier transform of t; T is the transmission cross-coefficient (TCC); p=lfx and q=mfy (l and m are integers, $f_x$ and $f_y$ are periodic frequencies in the x direction and y direction of the mask pattern, respectively, the method comprising the steps of:

(a) setting the mask conditions, assuming that an integer that depends on the maximum value of the coherence factor and on the periodic frequency of the mask pattern of the mask conditions that have been set is the maximum degree, calculating the Fourier transforms of the mask for up to the maximum degree;

(b) assuming that an integer that depends on the maximum value of the coherence factor and on the periodic frequency of the mask pattern of the mask conditions that have been set is the maximum degree, setting the optical conditions, calculating the transmission cross-coefficients for up to the maximum degree, and tabulating the calculated results as a table;

(c) setting the value of the coherence factor, varying the value of the coherence factor with the tables generated at steps (a) and (b) and Expression (1), and calculating the light intensity distributions for all the values of the coherence factor;

(d) varying the optical conditions and repeating steps (b) and (c) until the light intensity distributions are calculated for all the optical conditions; and (e) varying the mask conditions and repeating steps (a) to (d) until the light intensity distributions are calculated for all the mask conditions.

8. The parametric analyzing method as set forth in claim 7,
   wherein the optical conditions are data that represents characteristics of an optical system, the optical conditions being composed of any combination of the shape of a light source, the light intensity thereof, defocus, aberration, the phase of a pupil, the transmissivity thereof, the shape thereof, the numerical aperture NA of a condenser lens, and the coherence factor.

9. The parametric analyzing method as set forth in claim 7,
   wherein the mask conditions are data that represents characteristics of the mask, the mask conditions being composed of any combination of the shape of a mask pattern, the position thereof, the pitches thereof, the transmissivity of the mask, and the amount of the phase variation thereof.

10. A parametric analyzing method for calculating a light intensity distribution on a wafer with Expression (1) under given optical conditions and mask conditions in a photolithography process as a fabrication process of semiconductor devices, $$I(u,v) = \iiiint \hat{T}(p, q; p', q') \hat{t}(p, q) \hat{t}^*(p', q') \exp[-i2\pi((p-p')u + (q-q')v)] dp\, dp'\, dq\, dq' \quad (1)$$

where t is the complex amplitude transmissivity of the mask; $t^*$ is the complex conjugate of t; $\hat{t}$ is the Fourier transform of t; T is the transmission cross-coefficient (TCC); $p=lf_x$ and $q=mf_y$ (l and m are integers, $f_x$ and $f_y$ are periodic frequencies in the x direction and y direction of the mask pattern, respectively, the method comprising the steps of:

(a) categorizing given data as a coherence factor, the optical conditions, and the mask conditions and arranging the given data in the order thereof;

(b) setting the mask conditions, assuming that an integer that depends on the maximum value of the coherence factor and on the periodic frequency of the mask pattern of the mask conditions that have been set is the maximum degree, calculating the Fourier transforms of the mask for up to the maximum degree, and tabulating the calculated results as a table;

(c) assuming that an integer that depends on the maximum value of the coherence factor and on the periodic frequency of the mask pattern of the mask conditions that have been set is the maximum degree, setting the optical conditions, calculating the transmission cross-coefficients for up to the maximum degree, and tabulating the calculated results as a table;

(d) setting the value of the coherence factor, varying the coherence factor with the tables generated at steps (b) and (c) and Expression (1), and calculating the light intensity distributions for all the values of the coherence factor;

(e) varying the optical conditions and repeating steps (c) and (d) until the light intensity distributions are calculated for all the optical conditions; and (f) varying the mask conditions and repeating steps (b) to (e) until the light intensity distributions are calculated for all the mask conditions.

11. The parametric analyzing method as set forth in claim 10, wherein the optical conditions are data that represents characteristics of an optical system, the optical conditions being composed of any combination of the shape of a light source, the light intensity thereof, defocus, aberration, the phase of a pupil, the transmissivity thereof, the shape thereof, the numerical aperture NA of a condenser lens, and the coherence factor.

12. The parametric analyzing method as set forth in claim 10, wherein the mask conditions are data that represents characteristics of the mask, the mask conditions being composed of any combination of the shape of a mask pattern, the position thereof, the pitches thereof, the transmissivity of the mask, and the amount of the phase variation thereof.

13. A parametric analyzing method for calculating a light intensity distribution on a wafer with Expression (1) under given optical conditions and mask conditions in a photolithography process as a fabrication process of semiconductor devices, $$I(u,v) = \iiiint \hat{T}(p, q; p', q') \hat{t}(p, q) \hat{t}^*(p', q') \exp[-i2\pi((p-p')u + (q-q')v)] dp\, dp'\, dq\, dq' \quad (1)$$

where t is the complex amplitude transmissivity of the mask; $t^*$ is the complex conjugate of t; $\hat{t}$ is the Fourier transform of t; T is the transmission cross-coefficient (TCC); $p=lf_x$ and $q=mf_y$ (l and m are integers, $f_x$ and $f_y$ are periodic frequencies in the x direction and y direction of the mask pattern, respectively, the method comprising the steps of:

(a) assuming an integer that depends on the maximum value of a coherence factor and on the minimum value of the periodic frequency of the mask pattern of the mask conditions is the maximum degree of a light intensity distribution;

(b) setting the mask conditions, assuming that an integer that depends on the maximum value of the coherence factor and on the periodic frequency of the mask pattern of the mask conditions that have been set is the maximum degree, calculating the Fourier transforms for up to the maximum degree, and tabulating the calculated results as a table;

(c) setting the optical conditions, calculating the transmission cross-coefficients for up to the maximum degree, and tabulating the calculated results as a table;

(d) setting the value of the coherence factor, varying the value of the coherence factor with the tables generated at steps (b) and (c) and Expression (1), and calculating the light intensity distributions for all the values of the coherence factor;

(e) varying the optical conditions and repeating steps (c) and (d) until the light intensity distributions are calculated for all the optical conditions; and (f) varying the mask conditions and repeating steps (b) to (e) until the light intensity distributions are calculated for all the mask conditions.

14. The parametric analyzing method as set forth in claim 13, wherein the optical conditions are data that represents characteristics of an optical system, the optical conditions being composed of any combination of the shape of a light source, the light intensity thereof, defocus, aberration, the phase of a pupil, the transmissivity thereof, the shape thereof, the numerical aperture NA of a condenser lens, and the coherence factor.

15. The parametric analyzing method as set forth in claim 13, wherein the mask conditions are data that represents characteristics of the mask, the mask conditions being composed of any combination of the shape of a mask pattern, the position thereof, the pitches thereof, the transmissivity of the mask, and the amount of the phase variation thereof.

16. A parametric analyzing method for calculating a light intensity distribution on a wafer with Expression (1) under given optical conditions and mask conditions in a photolithography process as a fabrication process of semiconductor devices, $$I(u,v) = \iiiint \hat{T}(p, q; p', q') \hat{t}(p, q) \hat{t}^*(p', q') \exp[-i2\pi((p-p')u + (q-q')v)] dp\, dp'\, dq\, dq' \quad (1)$$

where t is the complex amplitude transmissivity of the mask; $t^*$ is the complex conjugate of t; $\hat{t}$ is the Fourier transform of t; T is the transmission cross-coefficient (TCC); $p=lf_x$ and $q=mf_y$ (l and m are integers, $f_x$ and $f_y$ are periodic frequencies in the x direction and y direction of the mask pattern, respectively, the method comprising the steps of:

(a) categorizing given data as a coherence factor, the optical conditions, and the mask conditions and arranging the categorize data in the order thereof;

(b) assuming that an integer that depends on the maximum value of the coherence factor and on the minimum value of the periodic frequency of the mask pattern of the mask conditions is the maximum degree;

(c) setting the mask conditions, assuming that an integer that depends on the maximum value of the coherence factor and on the periodic frequency of the mask pattern of the mask conditions that have been set is the maximum degree, calculating the Fourier transforms for up to the maximum degree, and tabulating the calculated results as a table;

(d) setting the optical conditions, calculating the transmission cross-coefficients for up to the maximum degree, and tabulating the calculated results as a table;

(e) setting the value of the coherence factor, varying the coherence factor with the tables generated at steps (c) and (d) and Expression (1), and calculating the light intensity distributions for all the values of the coherence factor;

(f) varying the optical conditions and repeating steps (d) and (e) until the light intensity distributions are calculated for all the optical conditions; and (g) varying the mask conditions and repeating steps (c) to (f) until the light intensity distributions are calculated for all the mask conditions.

17. The parametric analyzing method as set forth in claim 16, wherein the optical conditions are data that represents characteristics of an optical system, the optical conditions being composed of any combination of the shape of a light source, the light intensity thereof, defocus, aberration, the phase of a pupil, the transmissivity thereof, the shape thereof, the numerical aperture NA of a condenser lens, and the coherence factor.

18. The parametric analyzing method as set forth in claim 16, wherein the mask conditions are data that represents characteristics of the mask, the mask conditions being composed of any combination of the shape of a mask pattern, the position thereof, the pitches thereof, the transmissivity of the mask, and the amount of the phase variation thereof.

* * * * *